United States Patent [19]

White

[11] Patent Number: 5,187,726

[45] Date of Patent: Feb. 16, 1993

[54] HIGH RESOLUTION X-RAY LITHOGRAPHY USING PHASE SHIFT MASKS

[75] Inventor: Victor E. White, Madison, Wis.

[73] Assignee: Wisconsin Alumni Research Foundation, Madison, Wis.

[21] Appl. No.: 767,838

[22] Filed: Sep. 30, 1991

[51] Int. Cl.$^5$ .............................................. G21K 5/00
[52] U.S. Cl. ....................................... 378/35; 378/34
[58] Field of Search .................................. 378/34, 35

[56] References Cited

U.S. PATENT DOCUMENTS 4,360,586 11/1982 Flanders et al. ...................... 378/35
4,890,309 12/1989 Smith et al. ........................... 378/35

OTHER PUBLICATIONS

Y. C. Ku, et al., "Use of a Pi-Phase Shifting X-Ray Mask to Increase the Intensity Slope at Feature Edges," J. Vac. Sci. Technol. B, vol. 6, No. 1, Jan./Feb. 1988, pp. 150-153.
Jerry Z. Y. Guo, et al., "Verification of Partially Coherent Light Diffraction Models in X-Ray Lithography," presented at EIPB 1991 Symposium on May 30, 1991.

Primary Examiner—Craig E. Church
Attorney, Agent, or Firm—Foley & Lardner

[57] ABSTRACT

Phase shift masks for X-ray lithography include a carrier with a phase shift feature formed thereon having at least one sharply defined sidewall which is upright with respect to the surface of the carrier. The height of the feature on the phase shift mask is selected such that it provides a phase shift of substantially one-half wavelength of a selected band of the X-rays passed therethrough with respect to the X-rays that are passed through the carrier where there is no phase shift material. The phase shift mask is positioned closely above a target composed of a photoresist on a substrate, and X-rays are then passed therethrough, preferably being provided by synchrotron radiation. The collimated X-rays passed through the mask into the photoresist expose those areas of the photoresist away from the upright sidewalls sufficiently to cause those to be removed by developer, whereas the regions under the upright sidewalls have the X-ray intensity canceled by diffraction effects such that that the region under the sidewall is left in place on the substrate after developing. Very thin walled structures, in the range of 50 nanometers, can be formed in this manner by X-ray lithography.

37 Claims, 8 Drawing Sheets

HIGH RESOLUTION X-RAY LITHOGRAPHY USING PHASE SHIFT MASKS

FIELD OF THE INVENTION

This invention pertains generally to the field of micro-electronic processing techniques, particularly to X-ray lithography and to X-ray lithography masks.

BACKGROUND OF THE INVENTION

In the formation of micro-electronic devices using photolithographic techniques, the wavelength of the "light" utilized to form the image on the target photoresist imposes a fundamental limit on the available image definition. The image resolution, or minimum linewidth that can be imaged, is limited by the diffraction of the light at the edges of the features of the masks through which the light is projected. The commonly used figure of merit is the Fresnel number f calculated as $f = W^2/G\lambda$, where G is the gap distance between the mask and the target surface, $\lambda$ is the wavelength of the light being utilized and W is the feature size. The Fresnel number f provides a guide in assessing the obtainable resolution, with $f = 0.5$ corresponding to about what is usually considered the resolution limit.

To allow the creation of smaller micro-electronic structures than are attainable utilizing visible or ultraviolet optical systems, X-ray sources are being utilized. Synchrotrons are particularly suitable as X-ray sources for X-ray lithography since the synchrotron provides an intense, steady beam of substantially collimated X-ray photons having a mixture of wavelengths spanning soft to hard X-rays. Because the wavelength $\lambda$ of X-rays is smaller than the wavelength of optical or ultraviolet light, X-ray lithography inherently allows smaller features to be created. However, the feature size for X-rays is also ultimately limited, as the Fresnel number criterion also applies to X-ray lithography systems. The formula for the Fresnel number is approximate since it does not include physical effects, and resolutions in X-ray lithography systems less than 1,000 Angstroms (A) have been demonstrated with gaps larger than those that might be expected from the Fresnel number calculated for such systems. Nonetheless, the Fresnel number provides an approximate criterion for determining the ultimate resolution. Using this criterion, for example, it is found that to image 0.25 micrometer ($\mu$m) lines with one nanometer (nm) radiation would allow a maximum gap of only 12.5 $\mu$m. Thus, as the required line resolution shrinks, so does the available working distance between the mask and the target surface. It is generally considered difficult to perform X-ray lithography exposures at distances between the mask and target of less than 10 $\mu$m. It may be noted that there are two types of images that can be considered in determining the resolution in X-ray lithography, the aerial image (the X-ray intensity at the target surface) and the latent image (the image recorded in the target photoresist resist material).

Phase shifting masks have been used to increase the image definition in projection optical systems, and their use has been proposed to allow extension of the resolution limit of conventional visible and ultra-violet light optical lithographic systems. The phase shift mask includes a transparent layer of suitable thickness defining certain features which introduces a half wavelength ($\pi$) phase shift of the field $E_1$ of the light transmitted through the layer relative to the field $E_2$ of the light transmitted through an area without the transparent layer. The total field $E_t$ is obtained by addition of the two fields, i.e., $E_t = E_1 + E_2$, so that at some position along the image plane, the total field must become zero because of the continuity requirement. This creates a sharp modulation in the intensity pattern. A judicious choice of the phase shifting overlayer can improve the image even for complex patterns, although the technique works best for regular and repetitive cases such as those used in the manufacture of dynamic random access memories (DRAMs).

It has been suggested that an X-ray mask having an absorbent thickness appropriate for yielding a $\pi$ phase shift can improve image sharpness. See Y. C. Ku, et al., "Use of a Pi-Phase Shifting X-Ray Mask to Increase the Intensity Slope at Feature Edges," J. Vac. Sci. Technol. B, Vol. 6, No. 1, January/February 1988, p. 150–153. The masks described therein are absorbing masks, and the phase effects were used to refine the image rather than to define it.

SUMMARY OF THE INVENTION

In accordance with the present invention, a phase shift mask for X-ray lithography is provided having at least one phase shifting feature having at least one sharply defined sidewall which is upright with respect to the surface of the carrier on which the feature is supported. The material of the phase shifter feature introduces a half wavelength shift to X-ray photons passed therethrough compared to photons passed through a region of the mask having no phase shift material. The region of phase shift material is preferably of relatively low attenuation of X-rays passed through it, i.e., it is substantially "transparent" to X-rays, and is mounted on a carrier substrate which itself is substantially transparent to X-rays. The phase shift mask is placed in close proximity (e.g., preferably within five to ten micrometers) of a target structure which includes a layer of photoresist material. A beam of preferably collimated X-rays is then passed through the mask to expose the resist beneath the mask. Where a positive photoresist is used, the interaction of the X-ray photons with the photoresist causes the photoresist to be susceptible to dissolution in a developer. The target with the exposed photoresist thereon is then treated with a developer to remove all of the exposed photoresist, which leaves photoresist structures on the carrier which were not exposed to X-ray photons sufficiently to render such regions of the photoresist removable. Such structures occur underneath the intersection beneath the upright sidewalls of the phase shift features on the phase shift mask because of destructive interference of the spatially coherent X-rays which are passed through the mask. The interaction of the photons phase shifted by $\frac{1}{2}$ of a wavelength and the photons that are not so phase shifted leaves a zone between the two regions where there is very little effective X-ray energy deposited, preferably at a level below a sharply defined resist exposure threshold so that the resist is left unremoved in those areas.

The phase shift mask of the present invention allows very thin wall structures to be formed in the photoresist on the target substrate, in the range of a few hundred Angstroms wide. Typical X-ray photoresists such as polymethyl methacrylate (PMMA), may be utilized to provide such structures. It is found that the unexposed region is very sharply defined because of the rapid variation of the electrical field. The width of the region, i.e., the resolution, is dependent on the gap between the mask and the photoresist layer, while the modulation is not.

In accordance with the present invention, closed figure structures can readily be formed by providing a feature comprising a bounded region of phase shift material on the mask carrier with sharply defined upright sidewalls. However, the structures of the present invention can also be formed in other than closed figures. For example, by combining a phase shift mask region with a pure absorber region, (which substantially blocks the X-rays), an exposure of the target resist can be carried out in such a way that the region covered by the absorber of the target resist, after developing, is connected to the lines formed by the phase shift feature mask. Unconnected lines may also be formed utilizing a phase shift mask having some side walls which are substantially upright and also slanting sidewalls in which the material of the phase shift mask at the sidewall slants inwardly or outwardly. When the X-ray beam is passed through such a phase shift mask, the phase shift effect will cause destructive interference of the X-ray beam at the region underneath the upright sidewalls, but the area under the slanting sidewalls will not have substantial cancellation of the X-ray beam thereunder, resulting in substantially total exposure of the photoresist under these regions. The result is isolated thin walls formed in the target resist which correspond to the upright sidewalls in the phase shift feature on the mask. The slanting sidewalls of the phase shift mask can be produced, for example, by exposing a PMMA photoresist material with a beam of X-rays passed at an angle through an X-ray mask having an absorber on it, so that the absorption of X-rays into the photoresist takes place at an angle. The width of the lines left unexposed on the target photoresist can also be selected as desired by varying the gap between the mask structure and the target photoresist, or by varying the gap between selected regions of phase shifter material on the carrier of the mask and the underlying target photoresist material.

Further objects, features, and advantages of the invention will be apparent from the following detailed description when taken in conjunction with the accompanying drawings.

DETAILED DESCRIPTION OF THE INVENTION

Figure 1:
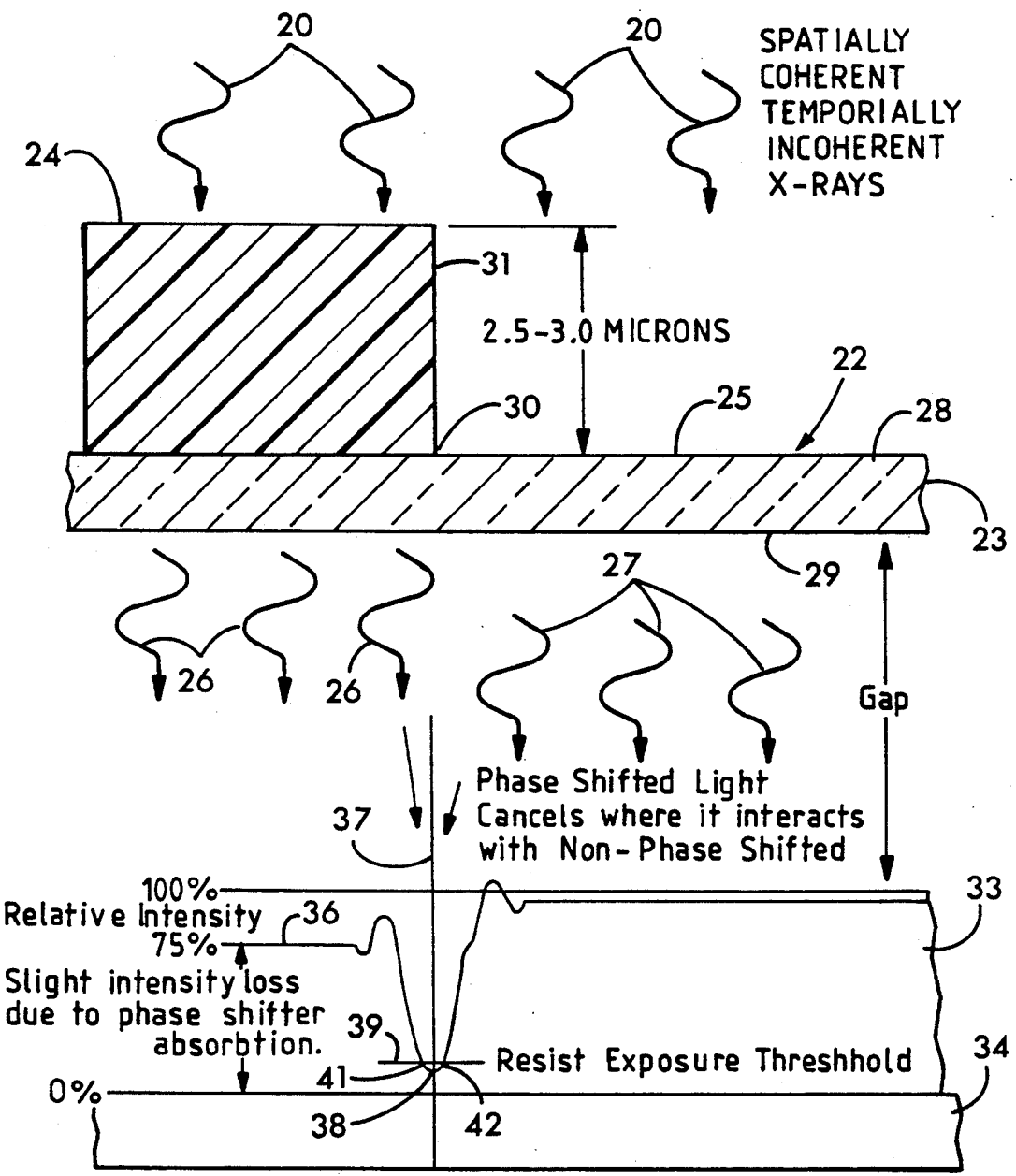
FIG. 1 is a schematic view of an X-ray exposure through a phase shift mask of the present invention to a target photoresist.

The present invention is particularly suited to the utilization of synchrotron X-ray sources which provide a highly collimated and broad band spectrum X-ray flux. The utilization of such an X-ray flux to provide selective exposure of a target photoresist to form structures smaller than that which can ordinarily be formed by absorption X-ray masks is illustrated in FIG. 1. The photon flux illustrated by the lines 20 in FIG. 1 is preferably provided from a synchrotron source and consists of a relatively broad spectrum of spatially coherent, temporally incoherent X-rays. The beam of X-rays 20 is passed through a phase shift mask 22 which includes a carrier 23, having flat top and bottom surfaces 28 and 29, which is substantially transparent to the X-rays, and a phase shifter feature 24 which is preferably transparent to X-rays or which only minimally absorbs the X-rays which are incident on it. The thickness of the phase shifter material 24 is selected such that the photons which are passed through the material 24 are phase shifted by approximately ½ of the wavelength (a $\pi$ shift) of the photons relative to those photons which pass through the region 25 of the mask in which there is no phase shift material. Where a broadband X-ray source, such as a synchrotron, is used, the thickness of the phase shifter material is preferably chosen to provide substantially a 0.5 wavelength phase shift over the region of X-rays which interact most with the photoresist. The phase shifted X-rays are illustrated by the lines labeled 26 in FIG. 1 and the unphase shifted X-rays are indicated by the lines labeled 27 in FIG. 1. The region defining the phase shifter feature 24 intersects the region 25 preferably at a sharp, well-defined intersection 30, wherein the phase shifter material 24 has a substantially upright sidewall 31 as illustrated in FIG. 1. The sidewall 31 is upright in the sense that it is substantially parallel to the direction of propagation of the substantially collimated incoming photons 20 and perpendicular to the surfaces 28 and 29 of the carrier 23.

The X-rays 26 and 27 which are passed through the mask 22 are incident on a layer of target photoresist 33 which is supported on a substrate 34. These photons are selectively absorbed by the photoresist 33 and, for purposes of illustration, the line 36 in FIG. 1 shows the relative X-ray energy absorbed by the photoresist from the X-rays 26 and 27 on either side of the line 37 that corresponds to the upright sidewall at the intersection 30 between the phase shift region 24 and the unphase-shift region 25 of the mask. The destructive interference of the spatially coherent X-rays 26 and 27 results in their fields canceling near the boundary line 37 so that the intensity of X-ray energy absorbed by the target photoresist reaches a minimum at a point 38 which lies on the center line 37. Preferably, the energy absorption represented by the point 38 is below the exposure threshold energy level 39 of the resist 33; that is, those areas of the resist which have received photon energy below the level of the line 39 illustrated in FIG. 1 will not, for a positive resist, be dissolvable by a developer solvent. The developer will however, dissolve the regions of the target photoresist to the left of the point 41 at which the threshold 39 intersects the exposure level curve 36 and to the right of the point 42 at which the threshold 39 intersects the curve 36. Of course, in real photoresists, the exposure threshold 39 is not a narrowly defined line as shown in FIG. 1 but varies over a finite transition zone. Thus, when the resist is removed by the developer solvent after exposure, the structure which is defined by the resist remaining on the substrate 34 will not have purely vertical sidewalls at the points 41 and 42 but rather somewhat sloping sidewalls. However, it is preferred that the resist threshold 39 be as sharp as possible to cause the sidewall structures to be as vertical and sharply defined as possible.

The phase shift mask 22 may be formed of a variety of materials suited for X-ray lithography processing. For example, the carrier 23 may be a fine membrane of silicon nitride ($Si_3N_4$) sufficiently thin not to significantly absorb the incoming X-ray flux (e.g., in the range of 1 $\mu$m or less). A suitable material for the phase shifter feature 24 is polymethyl methacrylate (PMMA) which provides the desired half wavelength phase shift for a suitable band of X-ray photons if it is formed in a film of a depth between 2.5 and 3 $\mu$m. A suitable target resist 33 is also PMMA, which is suited to X-ray lithography processing and has a relatively sharp threshold level 39. A 3.0 $\mu$m layer of PMMA as the phase shifter 24 introduces a phase shift of about one-half wavelength (a $\pi$ phase shift) over the region of the spectra (1,000 to 1,300 eV) where most of the energy in the target resist is deposited. Other materials, such as silicon dioxide, polycrystalline silicon, beryllium, and a variety of other materials, can be utilized as the phase shift material 24 to provide a phase shift mask which is harder and more stable than PMMA.

In general, the strength of the interference cancellation depends on the spectral properties of the phase shifting material 24 on the mask but not on the gap distance between the mask 22 and the top surface of the target resist 33. The gap between the mask 22 and the target resist 33 is preferably small, in the range of 15 $\mu$m or less, to obtain satisfactory line widths in the exposed target resist.

Figure 2:
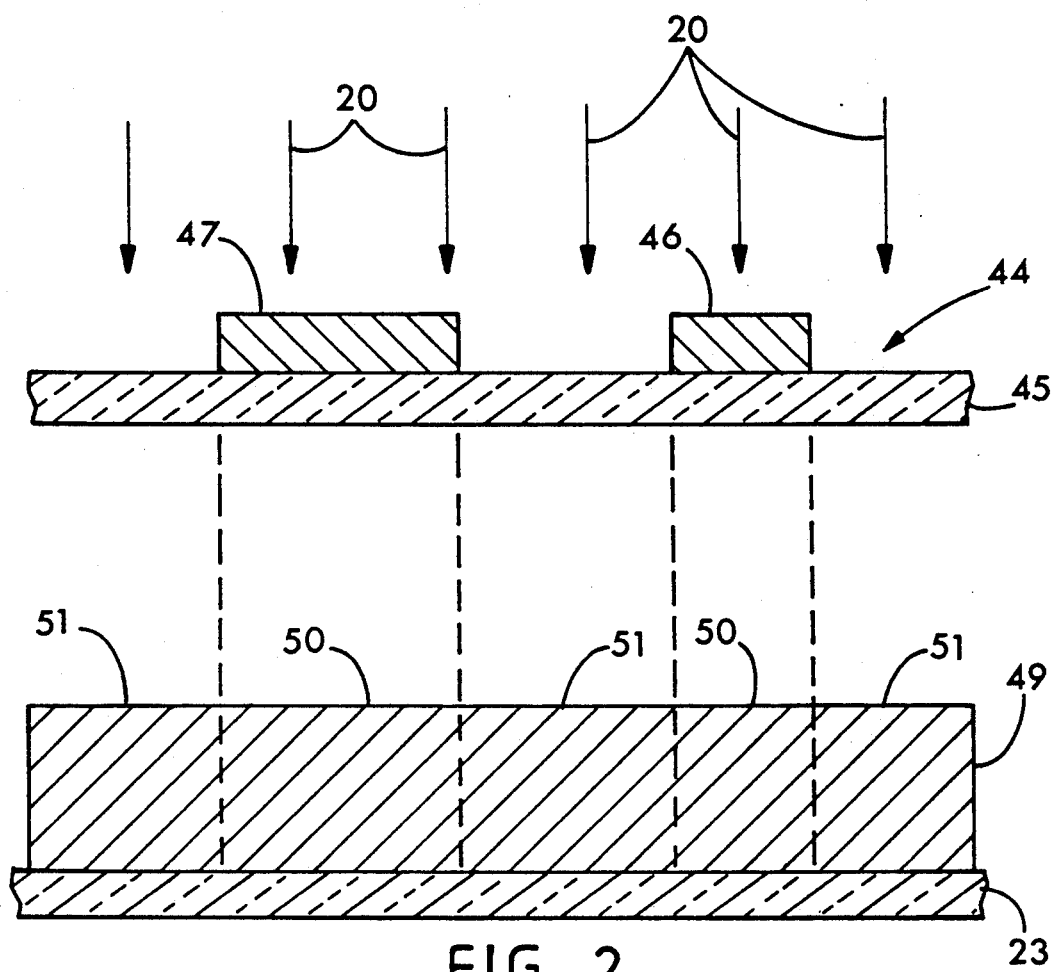
FIG. 2 is a schematic view of an exemplary process for forming phase shift masks in accordance with the present invention.
Figure 3:
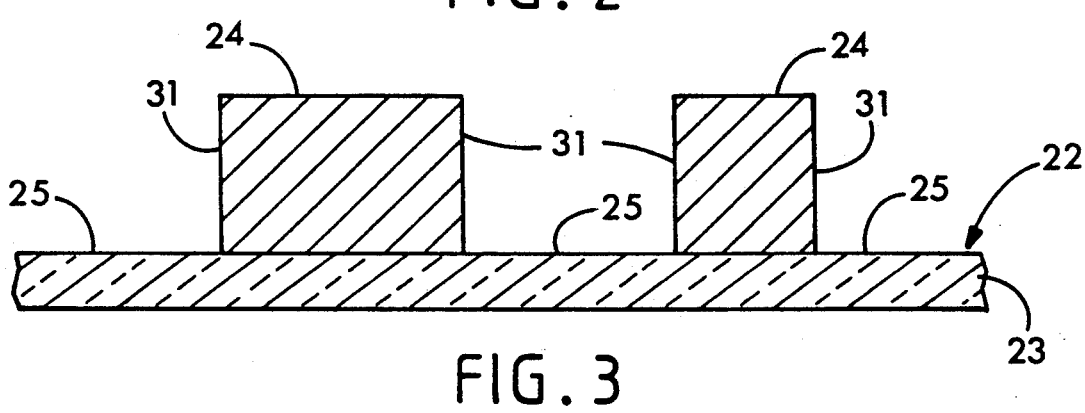
FIG. 3 is a schematic cross-sectional view of the phase shift mask in accordance with the present invention made by the process of FIG. 2.

The construction of a phase shift mask 22 in accordance with the present invention having a mask which will produce closed curves on the target resist is shown in FIGS. 2 and 3. In an exemplary technique for forming the mask, the X-rays 20 from the synchrotron beam are also utilized to provide an exposure through a master mask 44 formed of a carrier 45 (e.g., one $\mu$m or less silicon nitride) with metal absorbers 46 and 47 (e.g., gold) formed on the surface of the carrier 45. The absorbers 46 have sharply defined upright sidewalls so that when the substantially collimated X-rays in the beam 20 are passed therethrough, they expose the layer 49 of photoresist (e.g., PMMA) in a pattern corresponding to the metal absorber pattern 46 and 47, wherein areas 50 shielded by the absorbers 46 and 47 have unexposed resist whereas the areas 51 in which the X-rays in the beam 20 are not impeded by the metal absorber have fully exposed resist. The exposed PMMA is then removed utilizing a suitable PMMA developer bath, e.g., a mixture such as 2-(2-butoxyethoxy) ethanol, tetrahydro-1-4 oxazin (morpholine), and 2-aminoethanol (ethanolamine) and de-ionized distilled water. After development, the resist areas 24 left on the carrier 23 have the sharply defined vertical upright sidewalls 31 which are desirable for obtaining the maximum phase shift interference when the X-ray beam passes through the mask 22. X-ray lithography is particularly advantageous when forming the mask 22 since relatively thick layers of resist 49 can be plated onto the carrier 23 and exposed leaving very well-defined smooth, upright sidewalls 31. Of course, the X-ray mask can be formed utilizing the exposure of the resist to form a mold, with the phase shift material then being plated onto the carrier 23 around the structures 24 so that the deposited material assumes the shape of the sidewalls 31. The PMMA which defines the mold may then be removed by exposing it to X-rays and then developing it with a developer bath to remove the PMMA in its entirety.

The X-ray phase shift mask 22 shown in FIG. 3 has islands of the phase shifter features 24 surrounded by regions 25 on the carrier which have no phase shifter. Thus, when the mask 22 of FIG. 3 is used to expose a target layer of resist, the results after the resist is developed will be structure remaining which consists of a closed curve corresponding to the periphery of the phase shift features 24 on the mask. However, the present invention is not limited to production of closed curves of thin wall-like structures.

Figure 4:
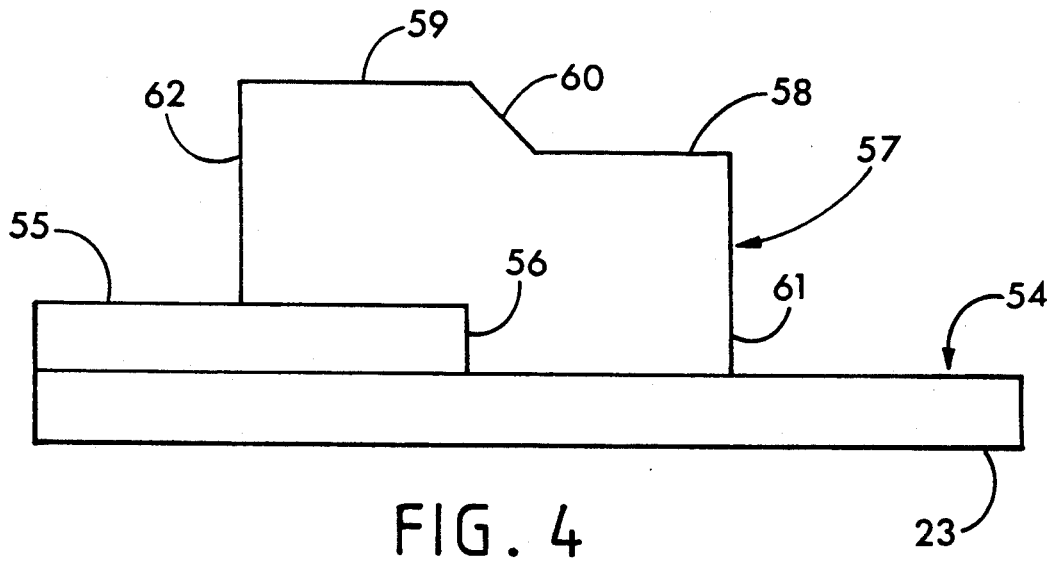
FIG. 4 is a cross-sectional view through a phase shift mask combining an absorber region and a phase shifter region.
Figure 5:
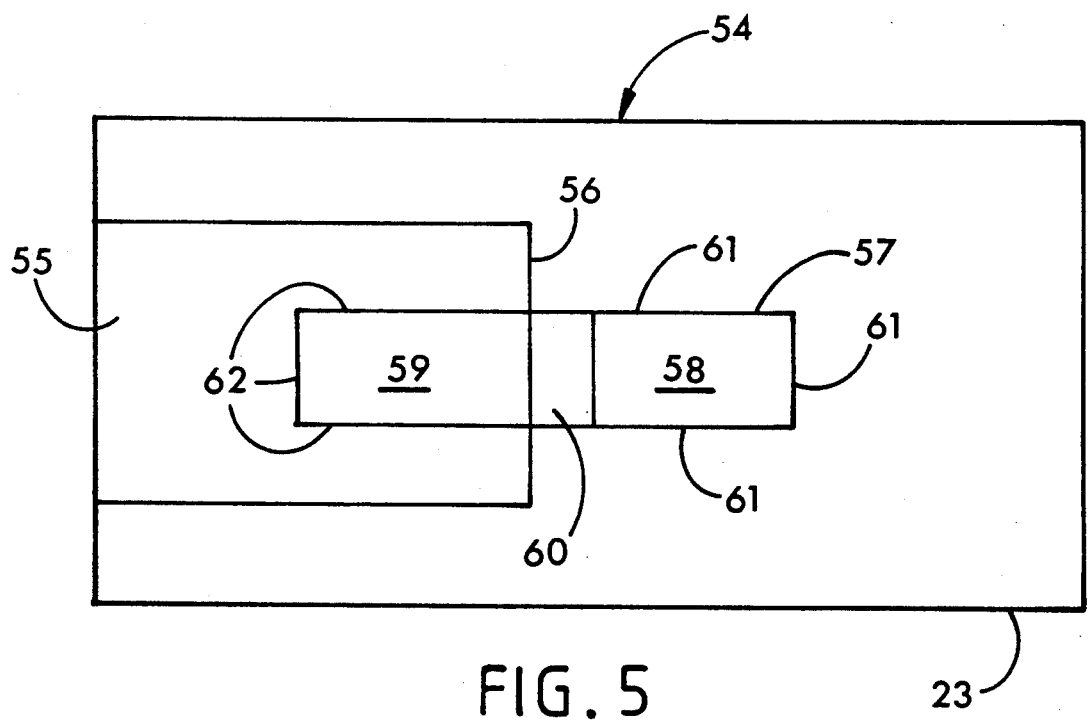
FIG. 5 is a top view of the phase shift mask of FIG. 4.

FIGS. 4 and 5 illustrate a mask 54 which can produce an example of a structure other than a closed thin wall. In the mask 54 shown in these figures, the carrier 23 has a layer of a metal absorber 55 (e.g., gold, typically in the range of 0.8 $\mu$m thick) having a terminating wall 56. A phase shifter 57 is then deposited on the carrier 23 and partially over the absorber 55 in the manner described above. The phase shifter 57 includes a lower section 58 which is of a thickness selected to introduce a half wavelength phase shift of photons passing therethrough with respect to the areas of the carrier which have no phase shifter or absorber formed thereon. The phase shifter 57 also has a higher level 59 which is plated on over the absorber 55. A transition region 60 joins the top surfaces of the regions 58 and 59 in a laterally sloped pattern rather than in a sharply defined vertically upright wall. The sloped section 60 will generally be naturally formed as the layer of PMMA resist (e.g., 2.5–3.0 $\mu$m PMMA) is deposited on the carrier and over the absorber 55 which stands up above the surface of the carrier.

Figure 6:
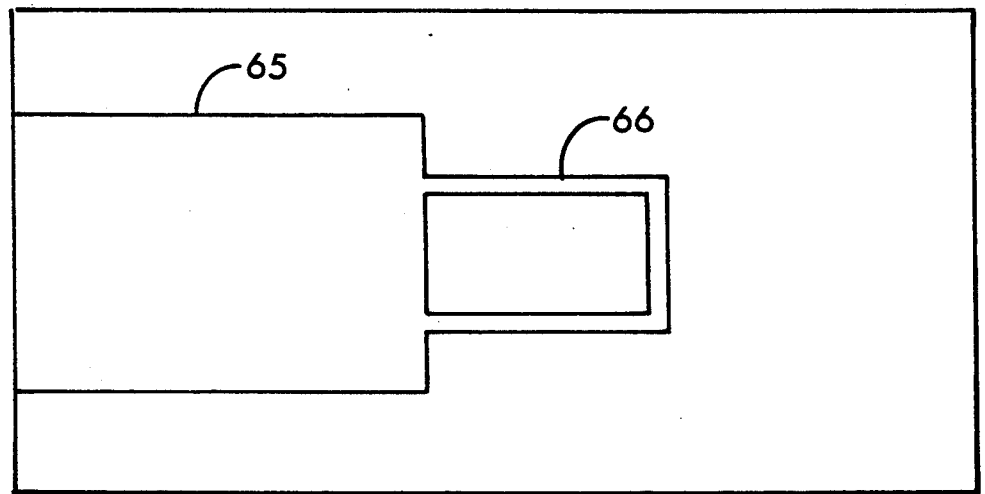
FIG. 6 is a top plan view of target photoresist pattern resulting from exposure of a photoresist with the mask structure of FIGS. 4 and 5 and subsequent developing.

When the mask 54 is used to expose a layer of target photoresist in the X-ray beam, a structure such as shown in FIG. 6 is formed on the substrate 34. A well-defined feature 65 is left in the developed target photoresist underneath the absorber 55, and a closed thin wall structure 66 is left in the developed resist under the boundary sidewall 61 of the phase shifter 57 where such sidewalls are not over the mask 55. Since the X-rays which pass through the phase shifter in the region 59 which is over the mask 55 are essentially completely absorbed by the absorber 55, there is no corresponding structure formed on the substrate 34 underneath the sidewalls 62 of the phase shifter.

Figure 7:
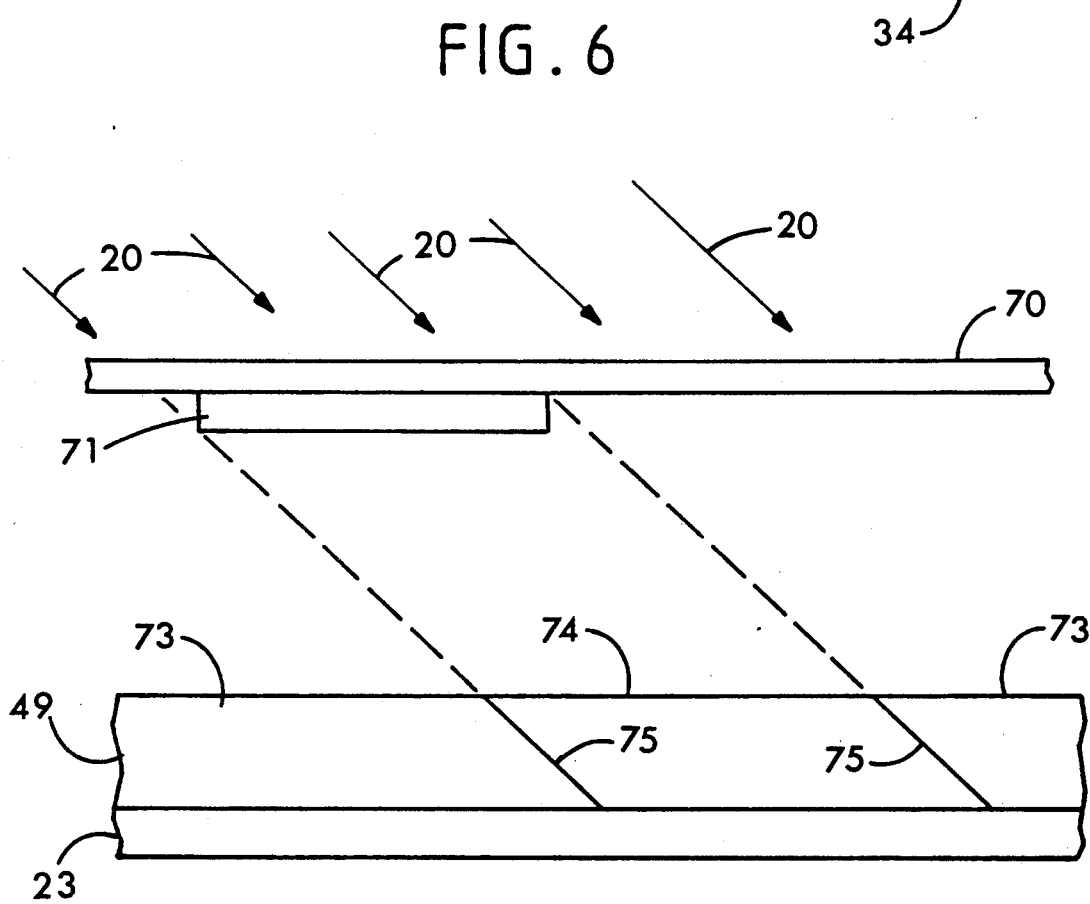
FIG. 7 is a schematic view of an alternative method of formation of X-ray masks using X-rays directed to the mask photoresist at an angle to the normal of the carrier surface wherein the exposed photoresist becomes the X-ray mask for subsequent processing.
Figure 8:
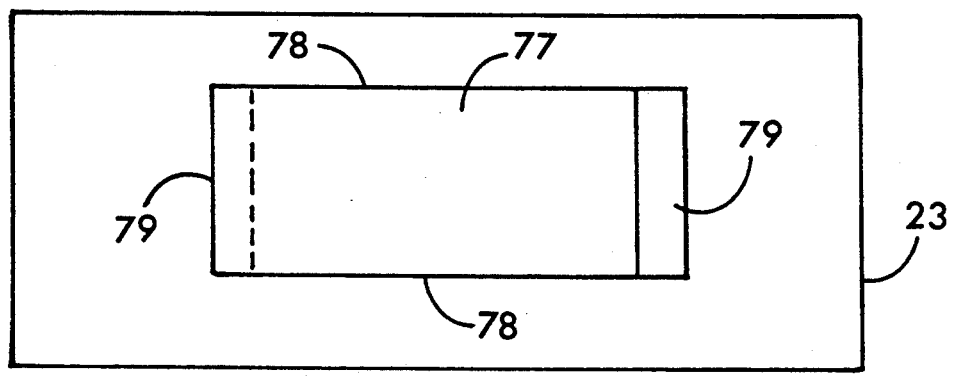
FIG. 8 illustrates the phase shift mask structure formed as illustrated FIG. 7, in plan view.
Figure 9:
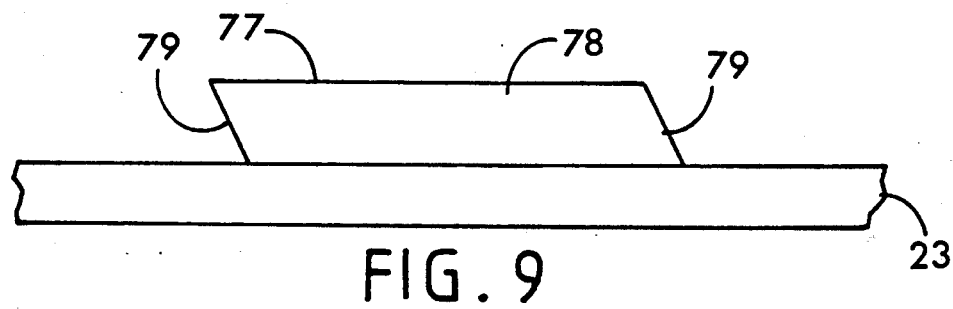
FIG. 9 is a cross-sectional view of the phase shift mask of FIG. 8.

It is also possible to make totally isolated open thin wall structures utilizing a phase shift mask in accordance with the present invention. This may be accomplished by creating a phase shifter having upright sidewalls, where phase shift effects are desired, and sloping sidewalls where phase shift effects are not wanted. The sloping walls result in X-rays of strongly different phases not interacting so that the fields do not substantially cancel, thus resulting in a relatively uniform high intensity X-ray flux across the interface. Such X-ray mask structures can be formed by providing an initial exposure of the X-ray resist 49 as illustrated in FIG. 7. The X-ray photons come in at an angle to a master (absorber) X-ray mask comprised of a carrier 70 having a metal absorber 71 formed thereon in the desired pattern. The X-rays passed through the mask intersect the resist layer (e.g., 2.75 μm PMMA) 49 at an angle, resulting in exposed regions 73 and an unexposed region 74 which meet at slanting surfaces 75. The result, after development, is a phase shifter 77 as illustrated in FIGS. 8 and 9 having substantially upright or vertical sidewalls 78 and sloping sidewalls 79. The amount of phase shift which will be provided to X-rays passing normally to the carrier 23 at the areas of the sidewalls 79 will vary continuously over the whole length of the sidewall, thus essentially eliminating any interference effects at the position under the sidewalls 79.

Figure 10:
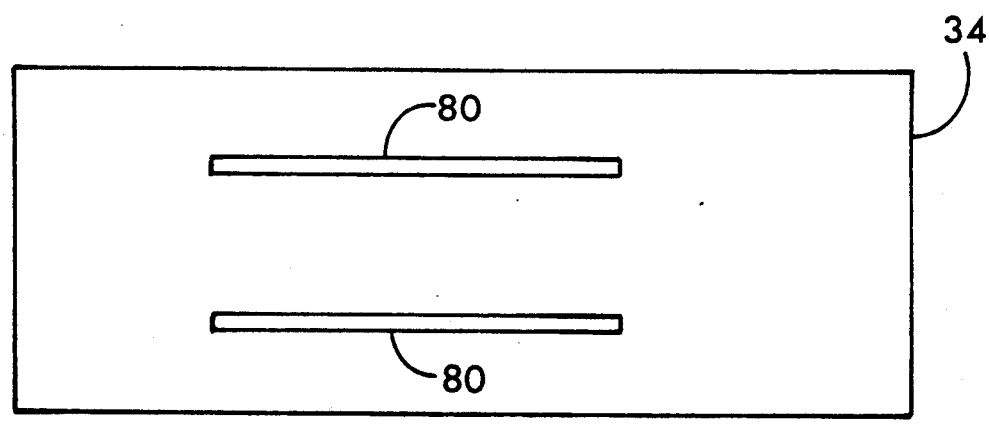
FIG. 10 is an illustrative plan view of isolated lines formed in a positive target resist using the mask structure of FIGS. 8 and 9.

Utilization of the mask of FIG. 9 to expose a target layer of photoresist results, after development, in the structure shown in FIG. 10 in which two thin walls 80 of photoresist structure are left on the carrier 34, corresponding to positions underneath the sidewalls 78 of the phase shifter 77.

Figure 11:
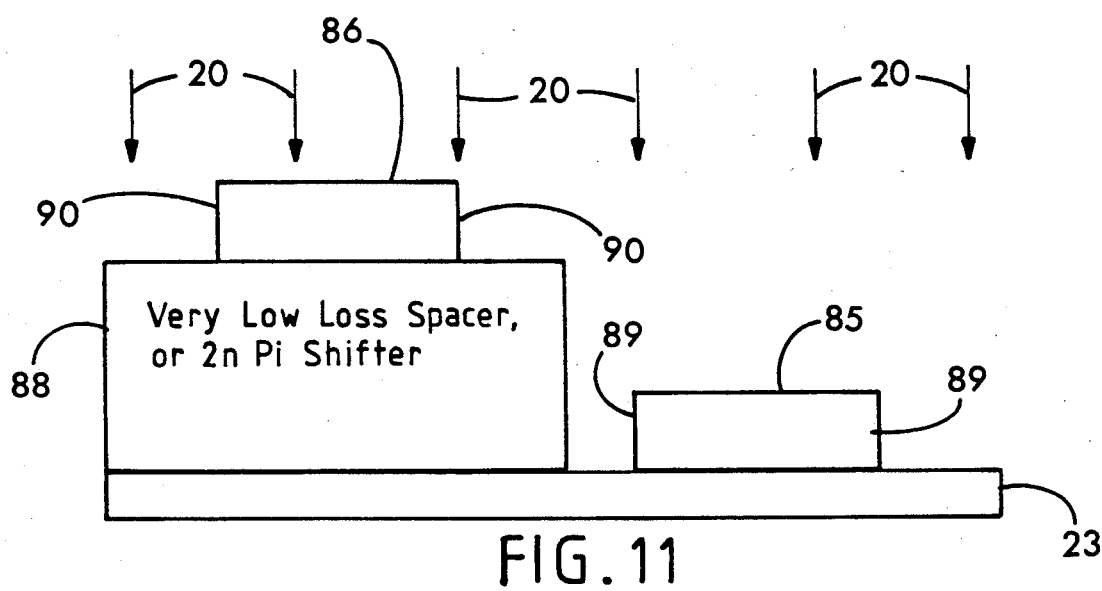
FIG. 11 is a schematic cross-sectional view of the exposure of a mask having a phase shifter feature directly on the carrier membrane and another phase shifter feature on a spacer material which provides essentially a multiple of a wavelength shift to the X-rays passing therethrough.
Figure 12:
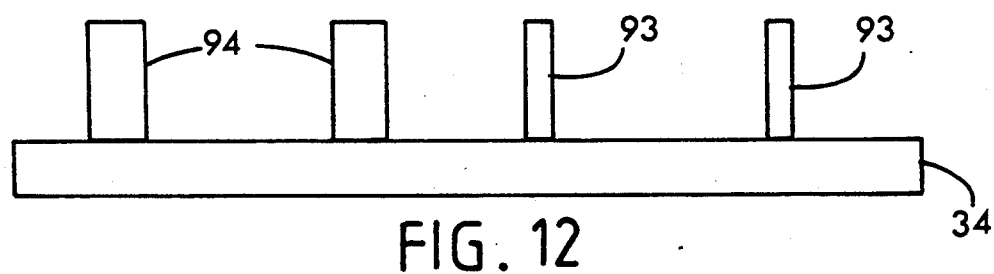
FIG. 12 shows the effect on the target photoresist of the exposure using the mask of FIG. 11.

Utilizing the phase shift masks of the present invention, it is possible to select the width of the thin wall structures which are ultimately formed. An example of the manner in which this may be accomplished is illustrated in FIGS. 11 and 12. The phase shift mask 84 shown in FIG. 11 includes a region of phase shift feature material 85 formed directly on the surface of the carrier 23 and another phase shift feature 86 which is formed on top of a spacer 88 which spaces the phase shifter 86 further away from the target material than the phase shifter feature 85. The spacer 88 may be formed of a very low loss material that provides substantially no phase shift of the X-rays passing through it (so that there is no interference effects at the sidewalls of the spacer 88), or the spacer 88 can comprise a material that will result in a phase shift of the X-rays but with no interference effects by selecting the thickness of the spacer 88 so that it is a multiple of a full wavelength phase shift (a 2π phase shift or multiple thereof). Thus, when X-rays 20 pass through the mask 84, interference effects will only take place at the sidewalls 89 of the phase shifter feature 85 and the sidewalls 90 of the phase shifter feature 86 resulting in thin wall structures as shown in FIG. 12 after development of the target photoresist. The thin wall structures 93 are formed under the sidewalls 89 of the feature 85, and the wider wall structures 94 are formed under the sidewalls 90 of the feature 86. In general, the larger the gap between the phase shifter and the target resist material, the broader the diffraction pattern, increasing the size of the interference region and thereby the width of the wall structures that are formed. Of course, the gap between the mask and the target structure can be varied in total to change the width of all of the lines that are formed in the target photoresist.

In the present invention, it is preferred that the X-ray flux 20 which is passed through the phase shift mask, have a fairly broad band of wavelengths therein since it is found that the sidelobes of the X-ray energy intensity in the interference pattern under the sidewalls of the phase shifter is more moderate where a broad band of X-rays is utilized rather than a substantially monochromatic X-ray source.

Figure 13:
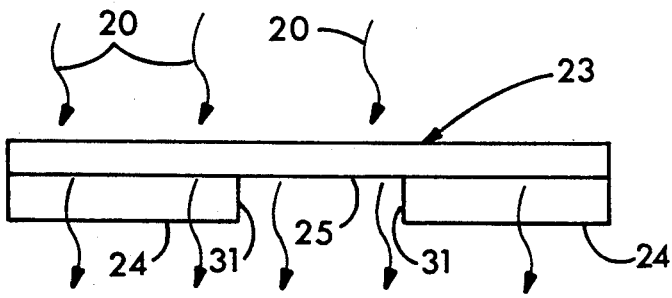
FIG. 13 is a schematic cross-sectional view through an exemplary phase shift mask.
Figure 14:
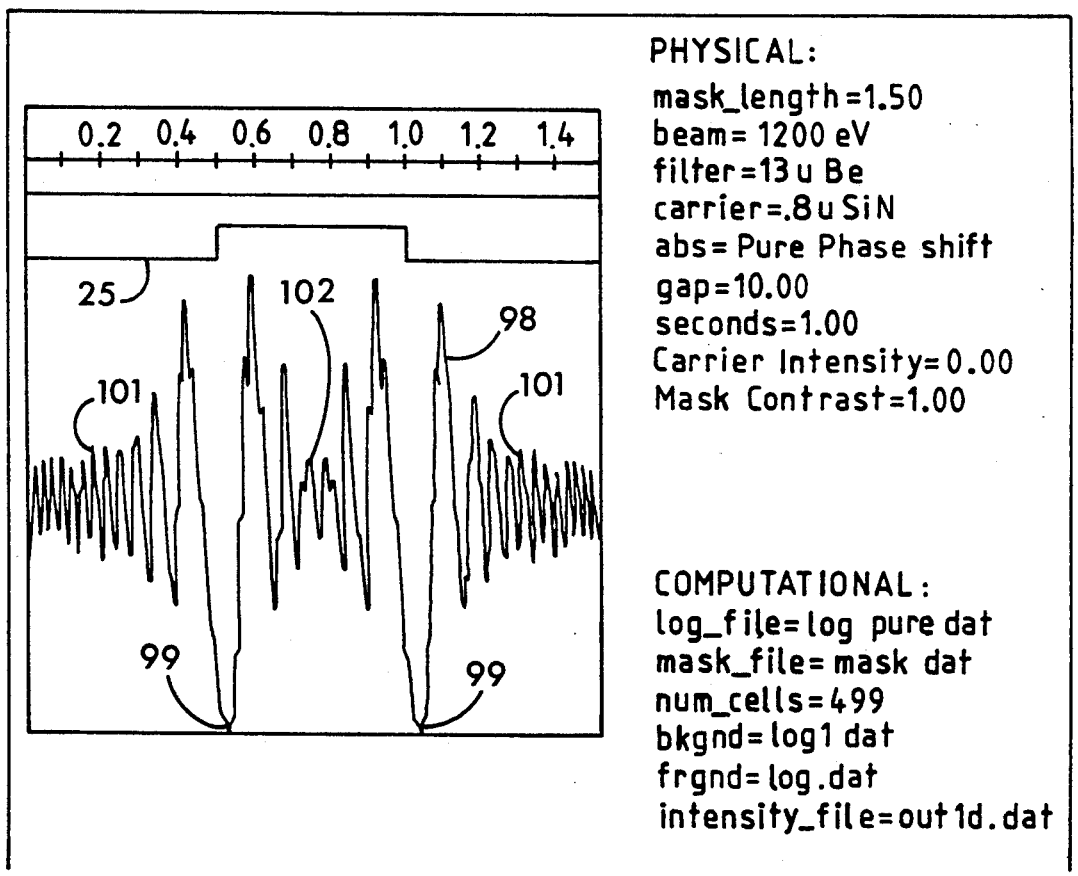
FIG. 14 is an illustrative graph showing X-ray intensity under the mask of FIG. 13 where the phase shift features are completely transparent to X-rays.

It is also preferable that the phase shifter material have some absorption of the X-rays that are passed therethrough. The reason for this is illustrated with respect to FIGS. 13 and 14. FIG. 13 shows a phase shift mask having a carrier 34 and two phase shifter features 24 formed thereon separated by a region 25 of no phase shift. If the phase shifter regions 24 are formed of a material which is a perfect phase shifting material with no absorption, an X-ray intensity pattern at the target photoresist for X-rays passed through the mask of FIG. 13 is illustrated by the graph 98 in FIG. 14. The X-ray flux intensity reaches a minimum at the points 99 which lie under the sidewalls 31 of the phase shifters 24. The relative level of the intensity, illustrated by the graph 101, in the areas underlying the phase shifters 24 is substantially the same level as the intensity, illustrated by the graph 102, in the area underlying the region of no phase shift 25. However, as illustrated in FIG. 14, there is a substantial oscillation in the X-ray intensity in positions adjacent to the minima 99.

Figure 15:
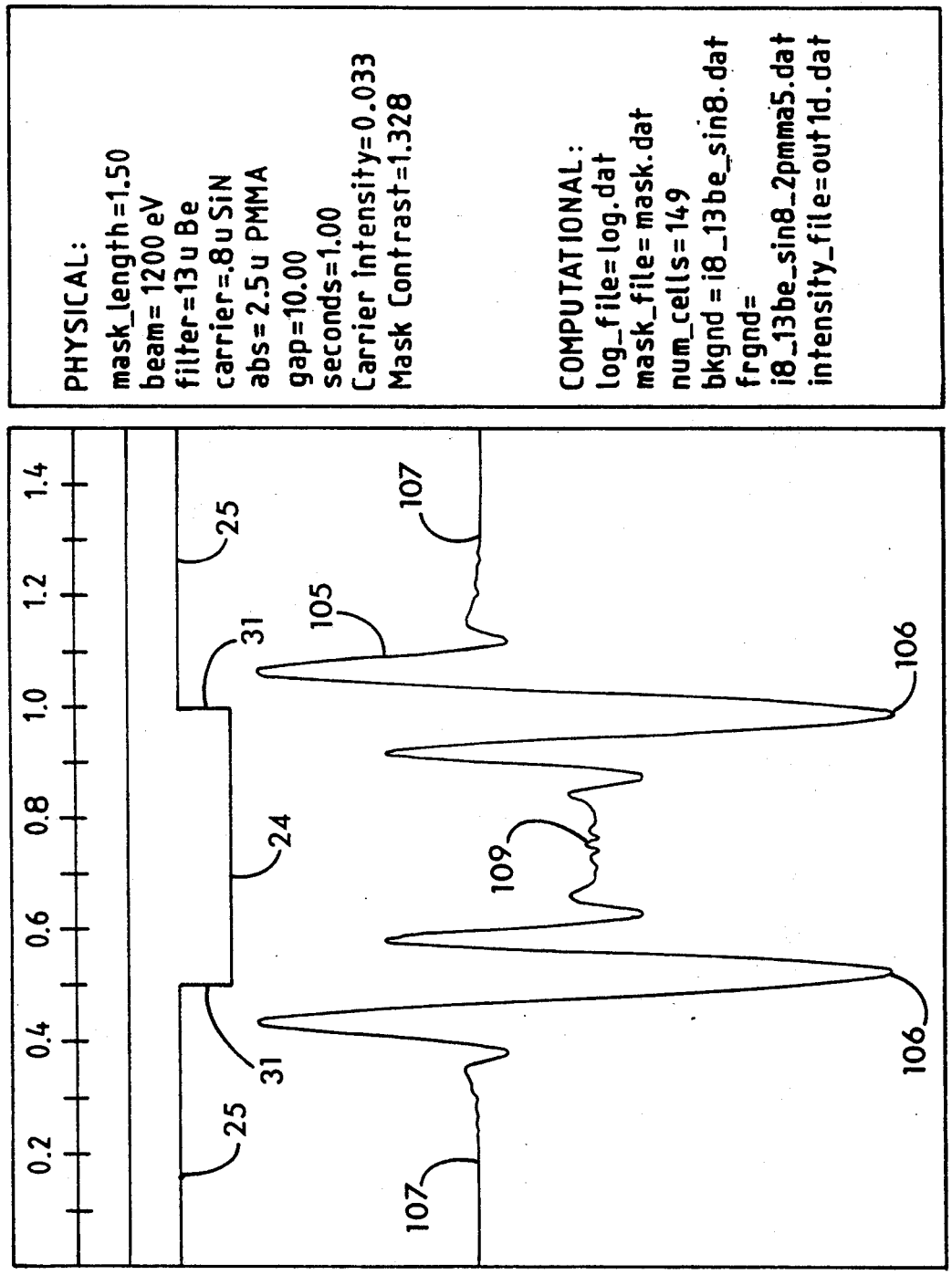
FIG. 15 is an illustrative graph as in FIG. 14 showing X-ray intensity where a phase shifter having some X-ray absorbence is used.

The effect of utilizing a practical phase shifter mask material is illustrated by the graph 104 in FIG. 15, which corresponds to the pattern of X-ray flux passed through a mask having a central region 24 of a real phase shifting material and surrounded by areas 25 of no phase shift. The minima 106 of the intensity lie under the positions of the sidewalls 31, but in this case the X-ray intensity in the areas 107 outside of the sidewalls which underlie the regions 25 is higher than the X-ray energy 109 in the region which underlies the phase shifter feature 24. Nonetheless, the minima 106 are sharply defined and differ substantially in energy from the somewhat lower energy level 109 under the phase shifter, and the oscillations in the X-ray intensity are significantly damped out. The graph 105 of FIG. 15 was computed for an absorbing mask formed of 2.5 μm PMMA on a carrier of 0.8 μm silicon nitride, with a gap between the X-ray mask and the target photoresist of 10 μm. The graph 105 was calculated assuming a monochromatic X-ray beam of 1200 eV and a 13 μm beryllium filter for an exposure lasting one second. A carrier intensity of 0.033 and a mask contrast of 1.328 were utilized. Some of these high frequency oscillations from the monochromatic case can be smoothed out by blurring the light source of the system. This would add spatial incoherence which would help smooth the image.

The present invention thus provides phase shift masks which are capable of achieving exposed structures on targets that have widths below 50 nm. Thin wall structures in photoresists can thus be produced by this technique. However, the technique can also be utilized to provide selective exposures of resists for other purposes commonly used in micro-electronic processing, such as removal of photoresist in selected areas to allow doping, oxidation, and deposit of other layers of materials. In accordance with the present invention, proximity X-ray lithography can be extended into the nanometer range, thus making it unnecessary to utilize projection systems for X-rays to achieve such small structures.

It is understood that the invention is not confined to the particular embodiments set forth hereon as illustrative, but embraces such modified forms thereof as come within the scope of the following claims.

What is claimed is:

1. An X-ray lithography mask comprising:
   (a) a carrier of thin material which does not substantially attenuate X-rays passed therethrough and having top and bottom surfaces;
   (b) at least one phase shifting feature formed on a surface of the carrier, the feature defined by a region of X-ray phase shifting material of a height selected such that a selected band of X-rays passed therethrough is phase shifted by substantially one-half wavelength of the X-rays, the feature having at least one sharply defined sidewall which is substantially upright with respect to the surface of the carrier, wherein the material forming the feature on the mask is PMMA.

2. The X-ray lithography mask of claim 1 further including an X-ray absorbing material formed in a pattern on the surface of the carrier, the material forming the phase shifting feature having a portion thereof overlying the X-ray absorbing material.

3. The X-ray lithography mask of claim 1 wherein the feature has a height above the carrier of about 2.5 to 3.0 micrometers.

4. The X-ray lithography mask of claim wherein the carrier is formed of silicon nitride having a thickness of about 1 micrometer or less.

5. AN X-ray lithography mask comprising:
   a carrier of thin material which does not substantially attenuate X-rays passed therethrough and having top and bottom surfaces;
   (b) at least one phase shifting feature formed on a surface of the carrier, the feature defined by a region of X-ray phase shifting material of a height selected such that a selected band of X-rays passed therethrough is phase shifted by substantially one-half wavelength of the X-rays, the feature having at least one sharply defined sidewall which is substantially upright with respect to the surface of the carrier, wherein the feature formed on the carrier has, in addition to the upright sidewall, at least one sidewall which is slanted at an angle with respect to the surface of the carrier.

6. The X-ray lithography mask of claim 5 wherein the material forming the phase shift feature is partially absorbent of X-rays passed therethrough.

7. An X-ray lithography mask comprising:
   (a) a carrier of thin material which does not substantially attenuate X-rays passed therethrough and having top and bottom surfaces;
   (b) at least one phase shifting feature formed on a surface of the carrier, the feature defined by a region of X-ray phase shifting material of a height selected such that a selected band of X-rays passed therethrough is phase shifted by substantially one-half wavelength of the X-rays, the feature having at least one sharply defined sidewall which is substantially upright with respect to the surface of the carrier; and
   (c) further including at least one spacer formed on the surface of the carrier, the spacer selected from the group of materials which provides substantially no phase shift of X-rays passed therethrough or of a height selected to introduce a full wave phase shift of X-rays passed therethrough or multiples thereof, and wherein there are a plurality of phase shifting features formed of phase shifting material, at least one of the features formed directly on the surface of the carrier and at least one of the features formed on the spacer, whereby when X-rays are passed through the X-ray lithography mask, the patterns formed in a target photoresist under the phase shifting feature on the spacer will be broader than the structures formed in the target photoresist under the phase shifting feature which is on the surface of the carrier.

8. An X-ray lithography mask and target set comprising:
   (a) a phase shift mask having:
      (1) a carrier of thin material which does not substantially attenuate X-rays passed therethrough and having top and bottom surfaces;
      (2) at least one phase shifting feature formed on the carrier, the feature defined by a region of phase shifting material of a height such that a selected band of X-rays passed therethrough is phase shifted by substantially one-half wavelength of the X-rays, the phase shift feature having at least one sharply defined sidewall which is substantially upright with respect to the surface of the carrier;
   (b) a target comprising a layer of photoresist on a substrate, the target photoresist having a top surface spaced closely beneath the phase shift mask and separated therefrom by a gap less than about fifteen micrometers; and
   further including at least one spacer formed on the surface of the carrier, the spacer selected from the group of materials which provides substantially no phase shift of X-rays passed therethrough or of a height selected to introduce a full wave phase shift of X-rays passed therethrough or multiples thereof, and wherein there are a plurality of phase shifting features formed of phase shifting material, at least one of the features formed directly on the surface of the carrier and at least one of the features formed on the space, whereby when X-rays are passed through the X-ray lithography mask, the patterns formed in the target photoresist under the phase shifting feature on the spacer will be broader than the structures formed in the photoresist under the phase shifting feature which is on the surface of the carrier.

9. A method of producing microstructures by X-ray lithogrpahy comprising:
   (a) providing an X-ray lithography mask having a carrier of thin material which does not substantially attenuate X-rays passed therethrough and having top and bottom surfaces, at least one phase shift feature formed on the surface of the carrier defined by a region of phase shifting material of a height such that a selected band of X-rays passed therethrough is phase shifted by substantially one-half wavelength of the X-rays and the phase shifting material is substantially transparent to the X- rays, the feature having at least one sharply defined sidewall which is substantially upright with respect to the surface of the carrier;

(b) providing a target of a layer of X-ray sensitive photoresist on a substrate and positioning the target under the mask and spaced therefrom by a small gap;

(c) passing a beam of substantially collimated X-rays through the mask onto the target to result in substantially complete exposure of the target photoresist in regions thereof that are adjacent to the regions under the sidewall of the phase shift feature including the region under the phase shift feature and with sufficiently low exposure of the target photoresist in the region underlying the upright sidewall of the phase shift feature due to interference effects that the photoresist in such region will not be developed by a photoresist developer; and (d) developing the target photoresist to remove the fully exposed resist and to leave thin wall structure on the substrate which had been under the upright sidewall of the phase shift feature on the mask.

10. The method of claim 9 wherein the gap between the mask and the target photoresist is ten micrometers or less.

11. The method of claim 9 wherein the step of passing a beam of substantially collimated X-rays is carried out by providing X-rays from a synchrotron and passing the X-ray flux from the synchrotron through the mask to the target photoresist.

12. The method of claim 9 wherein the target photoresist is formed of PMMA.

13. The method of claim 9 wherein the photoresist has a sharply defined resist exposure threshold and wherein the region in the target resist underlying the vertical sidewall of the phase shift feature receives less than the exposure threshold of the resist whereas the regions adjacent thereto receive greater exposure than the X-ray exposure threshold resist so as to provide, after developing of the exposed photoresist, sharply defined thin wall structures formed by the remaining photoresist on the 14. The method of claim 9 wherein the mask includes at least one phase shift feature having at least one upright sidewall and, in addition to the upright sidewall, at least one sidewall which is slanted with respect to the carrier so that no significant interference effects take place under the slanted sidewall as the X-rays are passed therethrough and wherein all of the photoresist under the slanted sidewall in the target photoresist is removed by the developer.

15. The method of claim 14 wherein the feature having a slanted sidewall has two slanted sidewalls which intersect and define the ends of an upright sidewall so that after passing the X-rays through the mask and developing the photoresist, an isolated open thin wall structure formed of the undeveloped photoresist is left remaining on the substrate.

16. The method of claim 9 wherein the X-ray mask further includes an X-ray absorber formed in a pattern on the surface of the carrier and wherein the material of the phase shift feature has a portion thereof which overlies the absorber structure, such that when X-rays are passed through the X-ray mask, the areas in the target resist under the absorber and under the upright sidewalls of the phase shift feature receive a low X-ray exposure and are left on the substrate after the target resist is developed.

17. The method of claim 9 wherein the mask further includes at least one spacer formed on the surface of the carrier which has essentially no phase shift of X-rays passed therethrough or has a selected of a height which introduces a full wave phase shift or multiples thereof of X-rays passed therethrough, and wherein there are a plurality of phase shifting features at least one of which is formed on top of the spacer and one is formed directly on the carrier surface, such that after X-rays are passed through the mask, those portions of the target resist underlying the upright sidewalls of the feature on the spacer leave broader wall structures on the substrate than those portions of the target resist underlying the upright sidewalls of the feature formed directly on the carrier surface.

18. The method of claim 9 wherein the material of the phase shift feature partially absorbs the X-rays pass therethrough.

19. The method of claim 9 wherein the carrier of the mask is formed of silicon nitride having a thickness of about one micrometer or less.

20. The method of claim 9 wherein the material of the phase shift feature on the mask is formed on PMMA.

21. The method of claim 20 wherein the feature has a height above the carrier surface of 2.5 to 3 micrometers.

22. A method of making an X-ray lithography phase shift mask comprising the steps of:

(a) providing an absorber X-ray mask comprising a carrier and an absorber laid thereon in a pattern corresponding to the desired pattern in the phase shift mask;

(b) passing a beam of substantially collimated X-rays through the absorber mask and onto a photoresist on a phase shift mask carrier spaced closely underneath the mask to expose the resist in all regions outside of the shadow of the absorber and to leave the resist material in the shadow of the mask unexposed, the height of the photoresist selected such that a selected band of X-rays passed therethrough is phase shifted by substantially one-half wavelength of the selected band of X-rays to which the photoresist and carrier are substantially transparent;

(c) developing the photoresist material on the phase shift mask carrier surface to remove the exposed material and leave the unexposed material in the desired pattern corresponding to the phase shift feature on the phase shift mask.

23. The method of claim 22 wherein the photoresist is PMMA.

24. The method of claim 22 wherein the X-rays are passed through the mask at an angle to the surface of the carrier of the mask to cast a shadow of the absorber in the photoresist material which is at an angle to the carrier of the phase shift mask, so that when the resist material is developed, the phase shift feature formed by the unexposed resist has slanted sidewalls corresponding to the angle of incidence of the X-rays passing through the absorber mask into the photoresist.

25. An X-ray lithography mask and target set comprising:

(a) a phase shift mask having:

(1) a carrier of thin material which does not substantially attenuate X-rays passed therethrough and having top and bottom surfaces;

(2) at least one phase shifting feature formed on the carrier, the feature defined by a region of phase shifting material of a height such that a selected band of X-rays passed therethrough is phase shifted by substantially one-half wavelength of the X-rays, the phase shift feature having at least one sharply defined sidewall which is substantially upright with respect to the surface of the carrier;

(b) a target comprising a layer of photoresist on a substrate, the target photoresist having a top surface spaced closely beneath the phase shift mask and separated therefrom by a gap, the photoresist selected such that when the selected ban of X-rays is passed through the phase shifting feature the photoresist will be substantially completely exposed under the phase shifting feature except at regions under the upright sidewall.

26. The X-ray lithography mask and target set of claim 25 wherein the height of the phase shifting feature is selected to provide substantially a one-half wavelength phase shift of a region of X-rays passed therethrough which interact the most with the target photoresist.

27. The X-ray lithography mask and target set of claim 25 wherein the feature has a height above the carrier of about 2.5 to 3.0 micrometers.

28. The X-ray lithography mask and target set of claim 25 wherein the carrier is formed of silicon nitride having a thickness of about 1 micrometer or less.

29. The X-ray lithography mask and target set of claim 25 wherein the material forming the phase shift feature is partially absorbent of X-rays passed therethrough.

30. The X-ray lithography mask and target set of claim 25 further including an X-ray absorbing material formed in a pattern on the surface of the carrier, the material forming the phase shifting feature having a portion thereof overlying the X-ray absorbing material.

31. An X-ray lithography mask and target set comprising:
(a) a phase shift mask having:
(1) a carrier of thin material which does not substantially attenuate X-rays passed therethrough and having top and bottom surfaces;
(2) at least one phase shifting feature formed on the carrier, the feature defined by a region of phase shifting material of a height such that a selected band of X-rays passed therethrough is phase shifted by substantially one-half wavelength of the X-rays, the phase shift feature having at least one sharply defined sidewall which is substantially upright with respect to the surface of the carrier;
(b) a target comprising a layer of photoresist on a substrate, the target photoresist having a top surface spaced closely beneath the phase shift mask and separated therefrom by a gap less than about fifteen micrometers, wherein the feature formed on the carrier has, in addition to the upright sidewall, at least one sidewall which is slanted at an angle with respect to the surface of the carrier.

32. An X-ray lithography mask and target set comprising:
(a) a phase shift mask having:
(1) a carrier of thin material which does not substantially attenuate X-rays passed therethrough and having top and bottom surfaces;
(2) at least one phase shifting feature formed on the carrier, the feature defined by a region of phase shifting material of a height such that a selected band of X-rays passed therethrough is phase shifted by substantially one-half wavelength of the X-rays, the phase shift feature having at least one sharply defined sidewall which is substantially upright with respect to the surface of the carrier;
(b) a target comprising a layer of photoresist on a substrate, the target photoresist having a top surface spaced closely beneath the phase shift mask and separated therefrom by a gap less than about fifteen micrometers, wherein the material forming the feature on the mask is PMMA.

33. A method of producing microstructures by X-ray lithography comprising:
(a) providing an X-ray lithography mask having a carrier of thin material which does not substantially attenuate X-rays passed therethrough and having top and bottom surfaces, at least one phase shift feature formed on the surface of the carrier defined by a region of phase shifting material of a height such that a selected band of X-rays passed therethrough is phase shifted by substantially one-half wavelength of the X-rays and wherein the phase shift material is substantially transparent to the X-rays, the feature having at least one sharply defined sidewall which is substantially upright with respect to the surface of the carrier;
(b) providing a target of a layer of X-ray sensitive photoresist on a substrate and positioning the target under the mask and spaced therefrom by a small gap;
(c) passing a beam of X-rays through the mask onto the target to result in substantially complete exposure of the target photoresist in regions thereof that are adjacent to the regions under the sidewall of the phase shift feature including the region under the phase shift feature and with low exposure of the target photoresist in the region underlying the upright sidewall of the phase shift feature due to interference effects; and
(d) developing the target photoresist with a developer for the photoresist.

34. The method of claim 33 wherein the X-ray mask further includes an X-ray absorber formed in a pattern on the surface of the carrier and wherein the material of the phase shift feature has a portion thereof which overlies the absorber structure, such that when X-rays are passed through the X-ray mask, The areas in the target resist under the absorber and under the upright sidewalls of the phase shift feature receive a low X-ray exposure.

35. The method of claim 34 wherein the gap between the mask and the target photoresist is ten micrometers or less.

36. The method of claim 34 wherein the mask includes at least one phase shift feature having at least one upright sidewall and, in addition to the upright sidewall, at least one sidewall which is slanted with respect to the carrier so that no significant interference effects take place under the slanted sidewall as the X-rays are passed therethrough.

37. The method of claim 36 wherein the feature having a slanted sidewall has two slanted sidewalls which intersect and define the ends of an upright sidewall.

* * * * *